United States Patent
Lynch

(10) Patent No.: US 9,932,951 B2
(45) Date of Patent: Apr. 3, 2018

(54) ENGINE START STOP SYSTEM BASED ON PROGRAMMABLE BATTERY VOLTAGE LEVELS

(71) Applicant: Jeffrey S. Lynch, Longmeadow, MA (US)

(72) Inventor: Jeffrey S. Lynch, Longmeadow, MA (US)

( * ) Notice: Subject to any disclaimer, the term of this patent is extended or adjusted under 35 U.S.C. 154(b) by 0 days.

(21) Appl. No.: 15/291,031

(22) Filed: Oct. 11, 2016

(65) Prior Publication Data
US 2017/0159633 A1 Jun. 8, 2017

Related U.S. Application Data

(60) Provisional application No. 62/238,907, filed on Oct. 8, 2015.

(51) Int. Cl.
*F02N 11/08* (2006.01)
*G01R 31/36* (2006.01)
*H02J 7/00* (2006.01)

(52) U.S. Cl.
CPC ........ *F02N 11/0862* (2013.01); *G01R 31/362* (2013.01); *G01R 31/3693* (2013.01); *H02J 7/0057* (2013.01)

(58) Field of Classification Search
CPC .. F02N 11/08; F02N 11/0862; F02N 11/0803; F02N 11/0825; F02N 2200/503; F02N 2200/061; F02N 2200/063; F02N 2200/12; F02D 41/26; H02J 7/0057; G01R 31/3693; G01R 31/362
USPC ............ 123/179.3, 179.4; 701/107, 112, 113
See application file for complete search history.

(56) References Cited

U.S. PATENT DOCUMENTS

| | | | | |
|---|---|---|---|---|
| 5,350,114 | A * | 9/1994 | Nelson | B60H 1/032 123/142.5 R |
| 9,689,367 | B2 * | 6/2017 | Schramme | F02N 11/0825 |
| 2009/0015203 | A1 * | 1/2009 | Oakes | G06Q 40/00 320/132 |
| 2009/0027056 | A1 * | 1/2009 | Huang | B60L 11/1857 324/439 |

* cited by examiner

*Primary Examiner* — Hai Huynh
(74) *Attorney, Agent, or Firm* — Dunlap Bennett & Ludwig PLLC; Brenden E. Squire

(57) ABSTRACT

A motor vehicle, such as a truck, battery charge monitoring and recharging system. The truck engine start/stop system initiates a battery recharge cycle based on programmable battery voltage levels. The system allows the user to individually program the appropriate voltage recharge levels dynamically to meet optimal standards based on location, environment, and other vehicle settings.

12 Claims, 10 Drawing Sheets

ENGINE START STOP SYSTEM BASED ON PROGRAMMABLE BATTERY VOLTAGE LEVELS

CROSS-REFERENCE TO RELATED APPLICATION

This application claims the benefit of priority of U.S. provisional application No. 62/238,907, filed Oct. 8, 2015, the contents of which are herein incorporated by reference.

SUMMARY OF THE INVENTION

Aspects of the present invention include a system, method, and apparatus in which a computing module is operatively connected to a computing system, an ignition system, and a battery voltage source of a motor vehicle. A display and control unit is operatively connected to the computing module, with the display unit presenting a user interface for providing a user input of a minimum battery voltage threshold for the computing module to monitor. The computing module initiates an engine start sequence to start an engine of the motor vehicle when the battery voltage threshold has been reached.

The system is configured to monitor a variety of environmental, operational states, and mechanical conditions of the motor vehicle in which it is installed to enhance the operational characteristics and performance of the motor vehicle. The display and control unit permits the user to program operate and utilize the system in a convenient menu driven display without the need to remember and execute sequence of complex control and switch procedures. Enhancements and safety features ensure the longevity of the motor vehicle and improve operator safety.

These and other features, aspects and advantages of the present invention will become better understood with reference to the following drawings, description and claims.

BACKGROUND OF THE INVENTION

The present invention relates to vehicle battery monitors, and more particularly to monitors to automatically recharge a vehicle battery upon detection of a designated threshold voltage.

Truck batteries typically lose their charge over time, preventing successful engine starting conditions should the battery be depleted beyond a certain state. They may lose their charge due to environmental factors (e.g., cold weather), long intervals between use, or usage of devices that draw down battery voltage (e.g., refrigerator in truck). This invention allows the user to maintain an appropriate battery charge. Other systems do not provide battery voltage level programming and/or customization.

This solution allows the user to individually program the appropriate voltage levels dynamically to meet optimal standards based on location, environment, and other vehicle settings.

As can be seen, there is a need for a vehicle battery charge monitor that permits the user to individually program the appropriate voltage levels dynamically to meet optimal standards based on location, environment, and other vehicle settings.

DETAILED DESCRIPTION OF THE INVENTION

The following detailed description is of the best currently contemplated modes of carrying out exemplary embodiments of the invention. The description is not to be taken in a limiting sense, but is made merely for the purpose of illustrating the general principles of the invention, since the scope of the invention is best defined by the appended claims.

Figure 1:
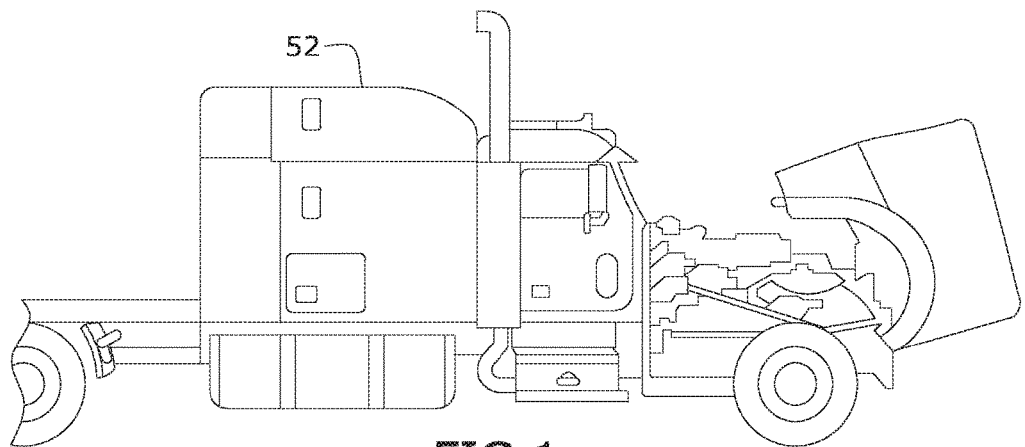
FIG. 1 illustrates a motor vehicle which may be fitted with the system of the present invention.
Figure 2:
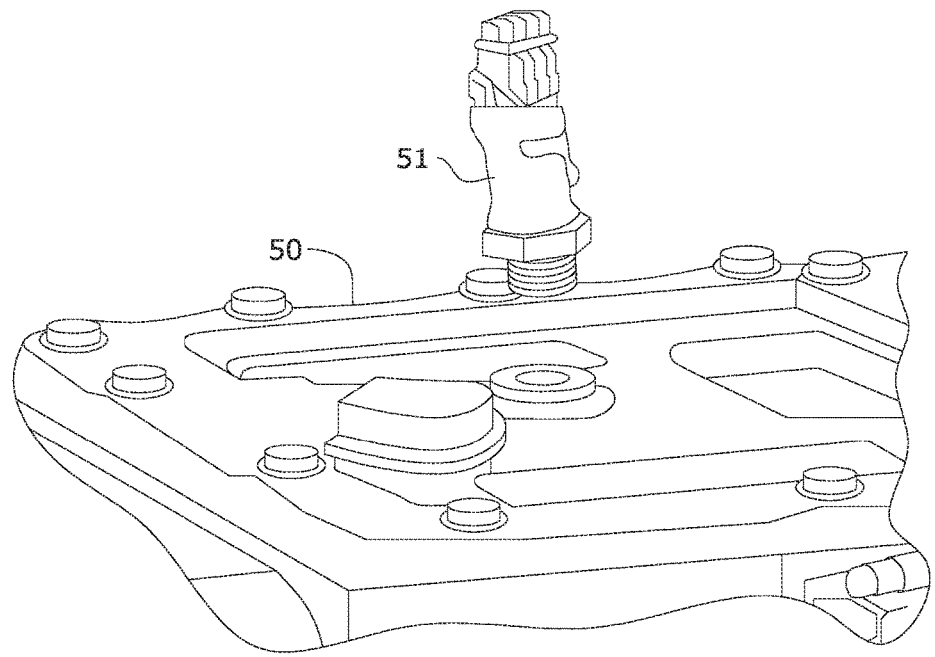
FIG. 2 illustrates a neutral safety switch for a motor vehicle equipped with a manual transmission.

Broadly, an embodiment of the present invention provides a motor vehicle battery state condition monitor that senses when a battery of a motor vehicle, such as a truck, shown in FIG. 1 has depleted a specified amount of energy and automatically triggers a recharging cycle by starting the engine of the vehicle.

As stated above, truck batteries typically lose their charge over time, thereby preventing a successful start of the truck engine due to the depleted condition of the battery. They may lose their charge due to environmental factors (e.g., cold weather), long intervals between use, or usage of devices that draw down battery voltage (e.g., refrigerator in the truck). The present invention allows the user to maintain an appropriate battery charge to ensure starting of the vehicle motor, based on existing environmental conditions of the vehicle. For example, the system and method of the present invention may automatically start a truck and may run the truck engine for a programmed amount of time (e.g., 20 minutes) when the battery voltage falls below a programmed level (e.g., 12.2 volts).

The system of the present invention is different from and better than existing systems in the field because it is programmable in terms of both battery voltage thresholds and vehicle run time. This allows the user to have the most appropriate settings based on their location (i.e., weather) and vehicle type.

Figure 3:
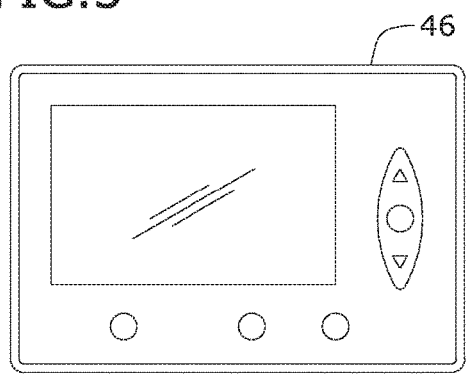
FIG. 3 illustrates an embodiment of a display and control unit of the system.
Figure 4:
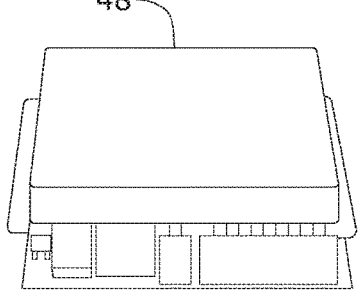
FIG. 4 illustrates an embodiment of a computer module according to aspects of the invention.
Figure 5:
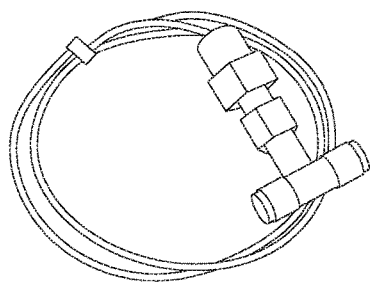
FIG. 5 illustrates an embodiment of a first wiring harness.
Figure 6:
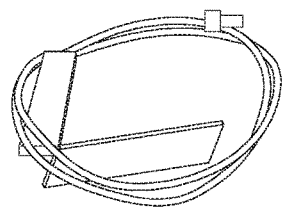
FIG. 6 illustrates an embodiment of a second wiring harness.
Figure 7:
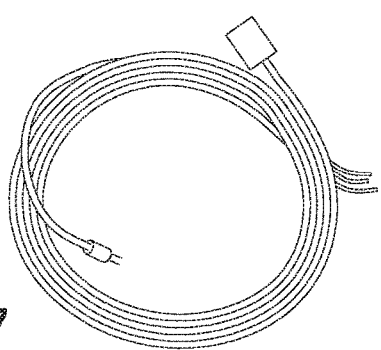
FIG. 7 illustrates an embodiment of a third wiring harness.
Figure 8:
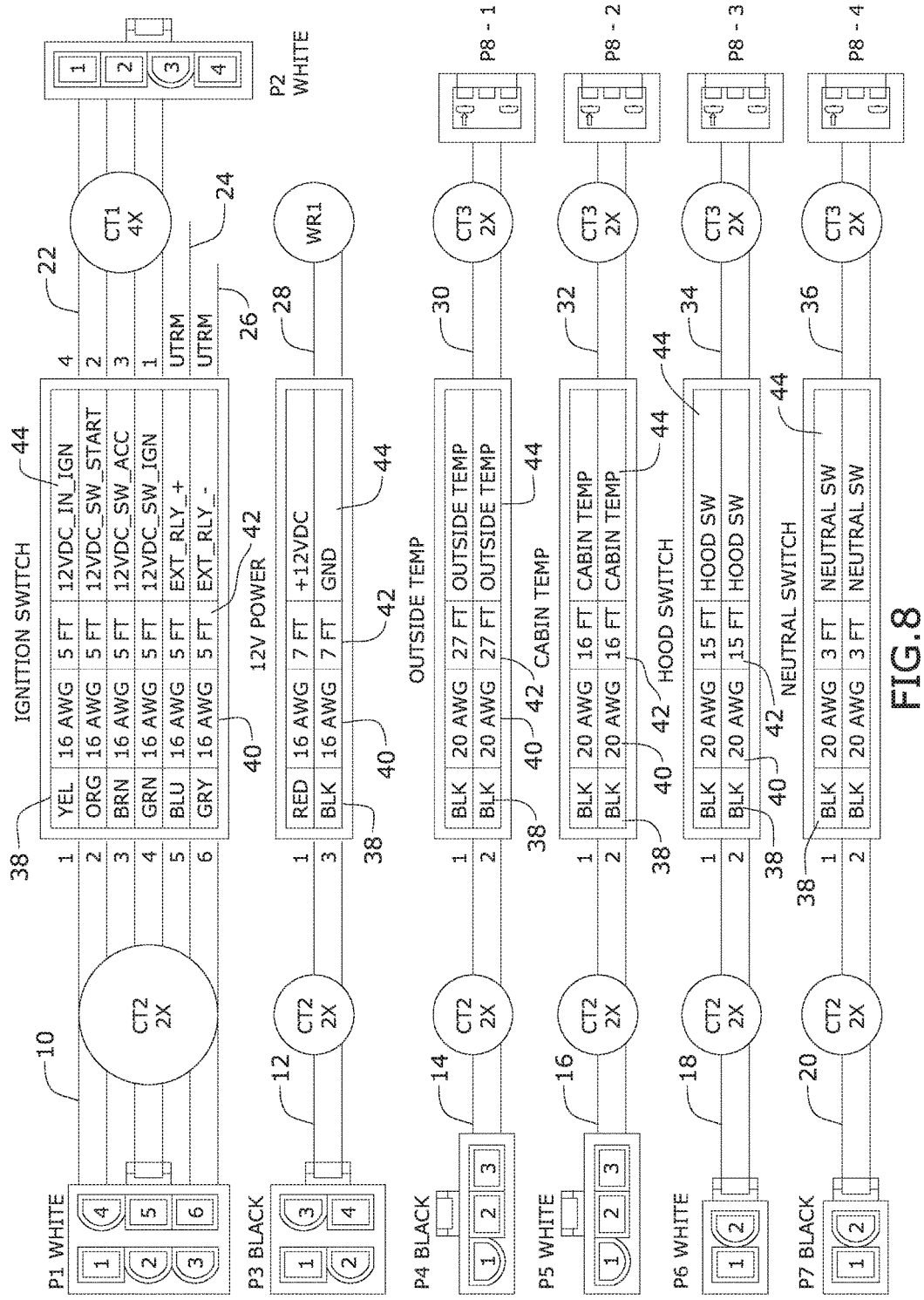
FIG. 8 is a schematic wiring diagram of components of the system.
Figure 9:
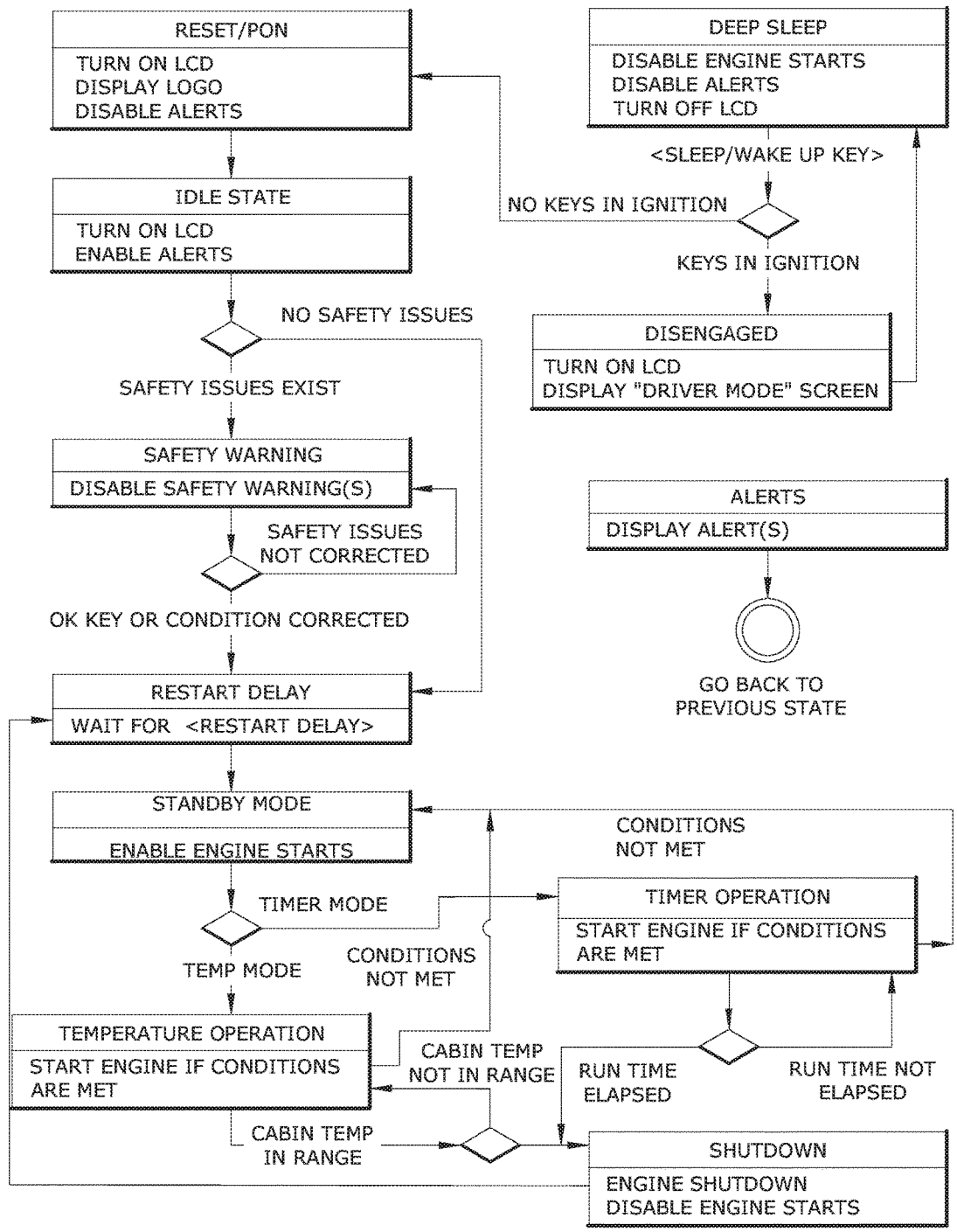
FIG. 9 is a flowchart illustrating a first embodiment of the operational states of the system.
Figure 10:
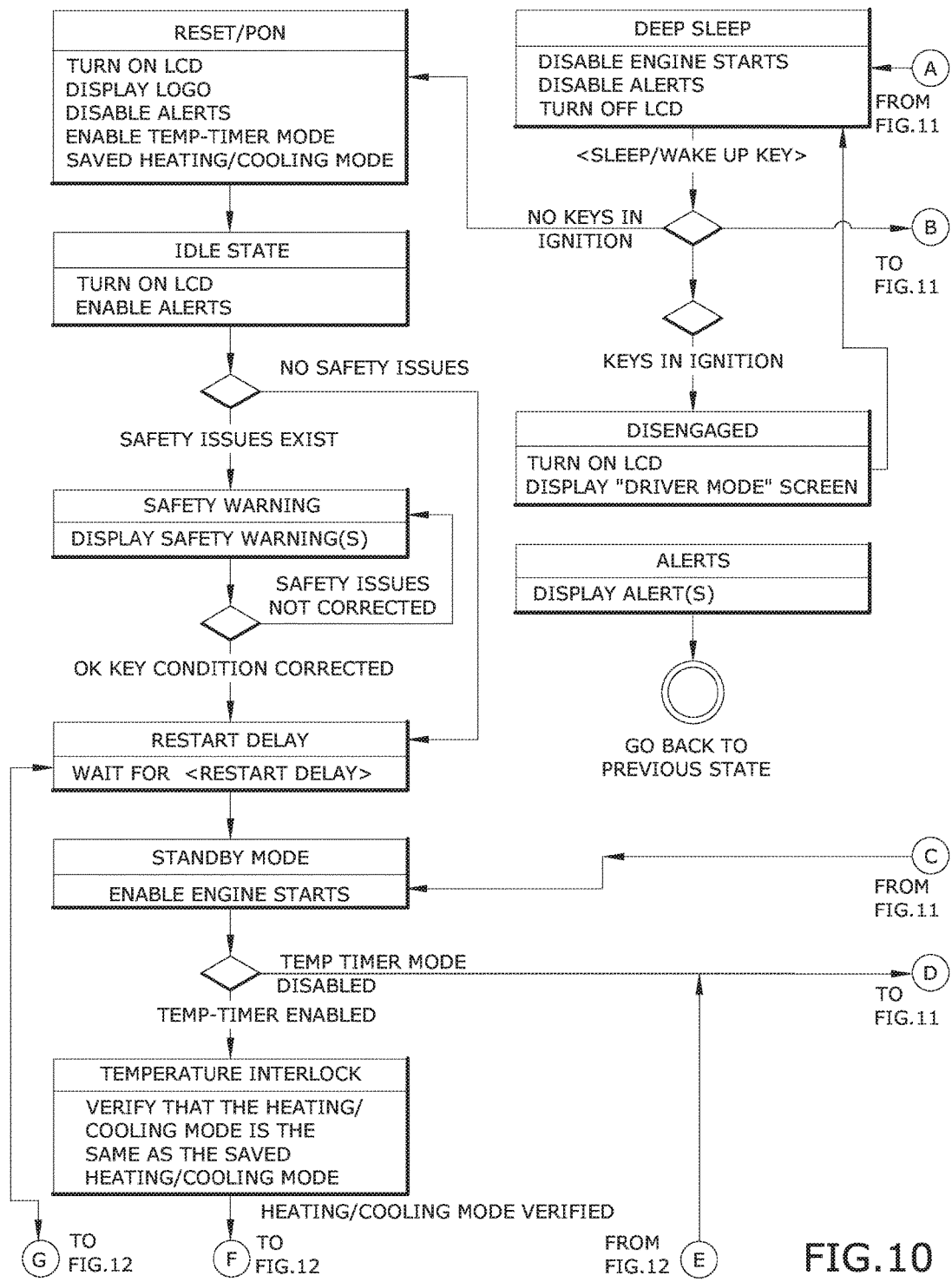
FIG. 10 is a flowchart illustrating a second embodiment of the operational states of the system.
Figure 11:
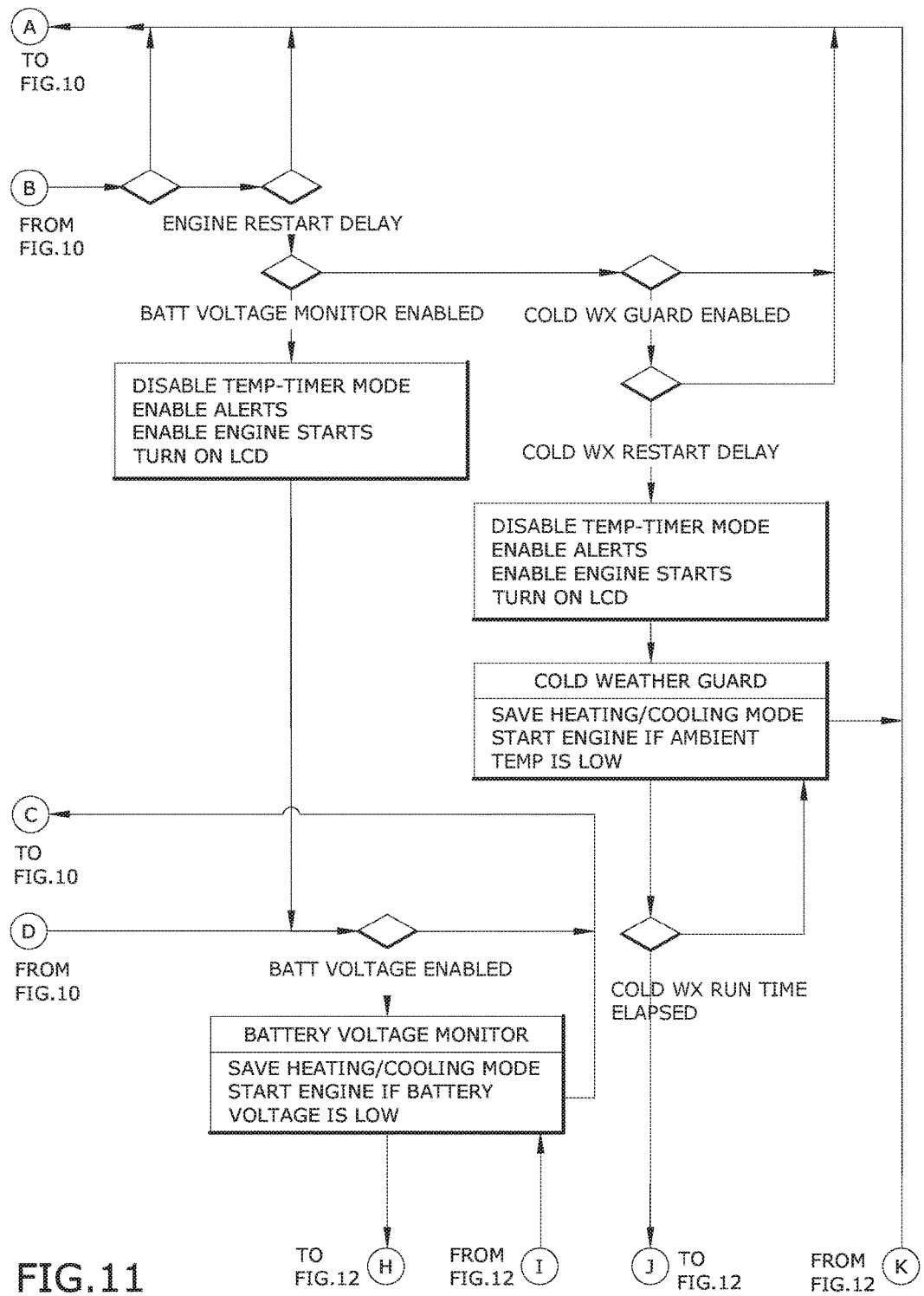
FIG. 11 is a continuation of the operational states flow chart of FIG. 10.
Figure 12:
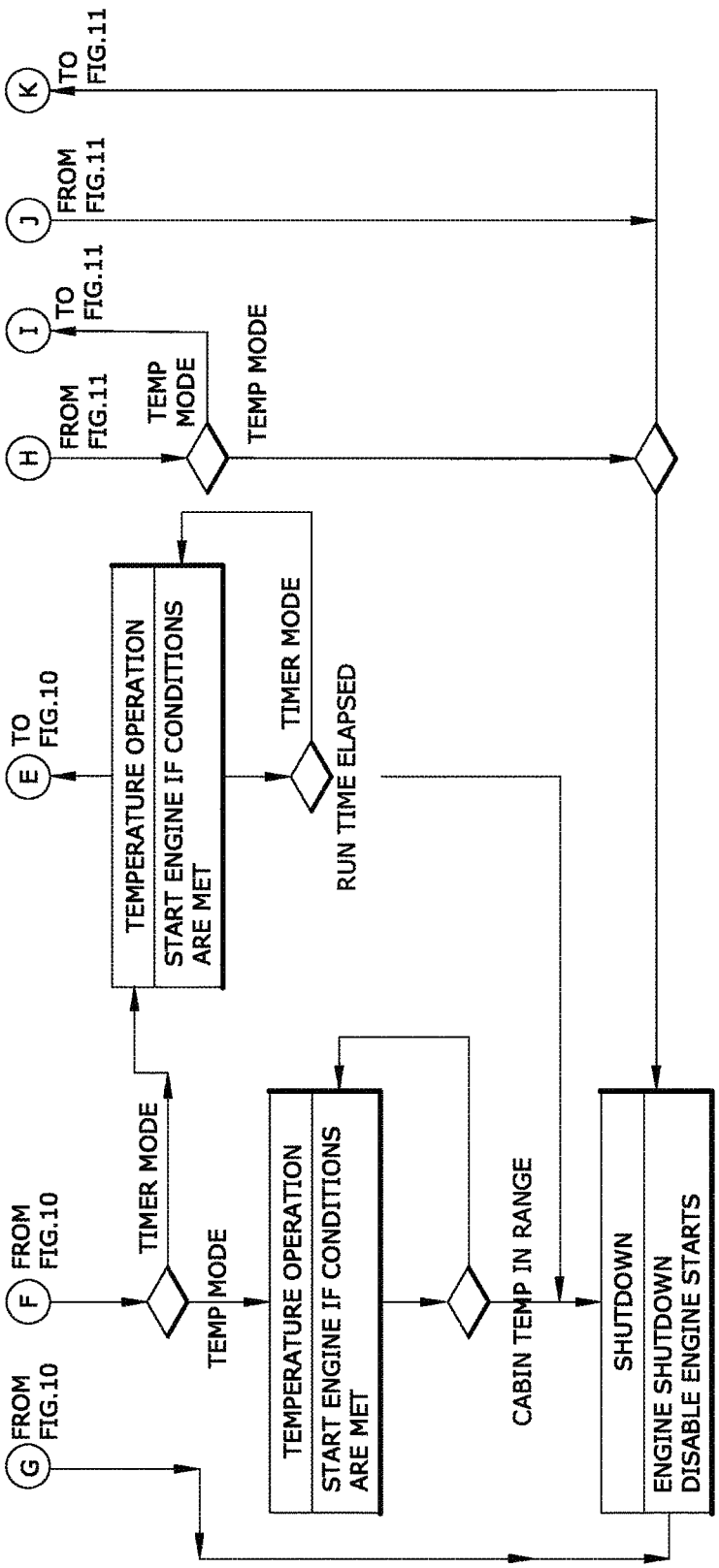
FIG. 12 is a continuation of the operational states flow chart of FIGS. 10 and 11.
Figure 13:
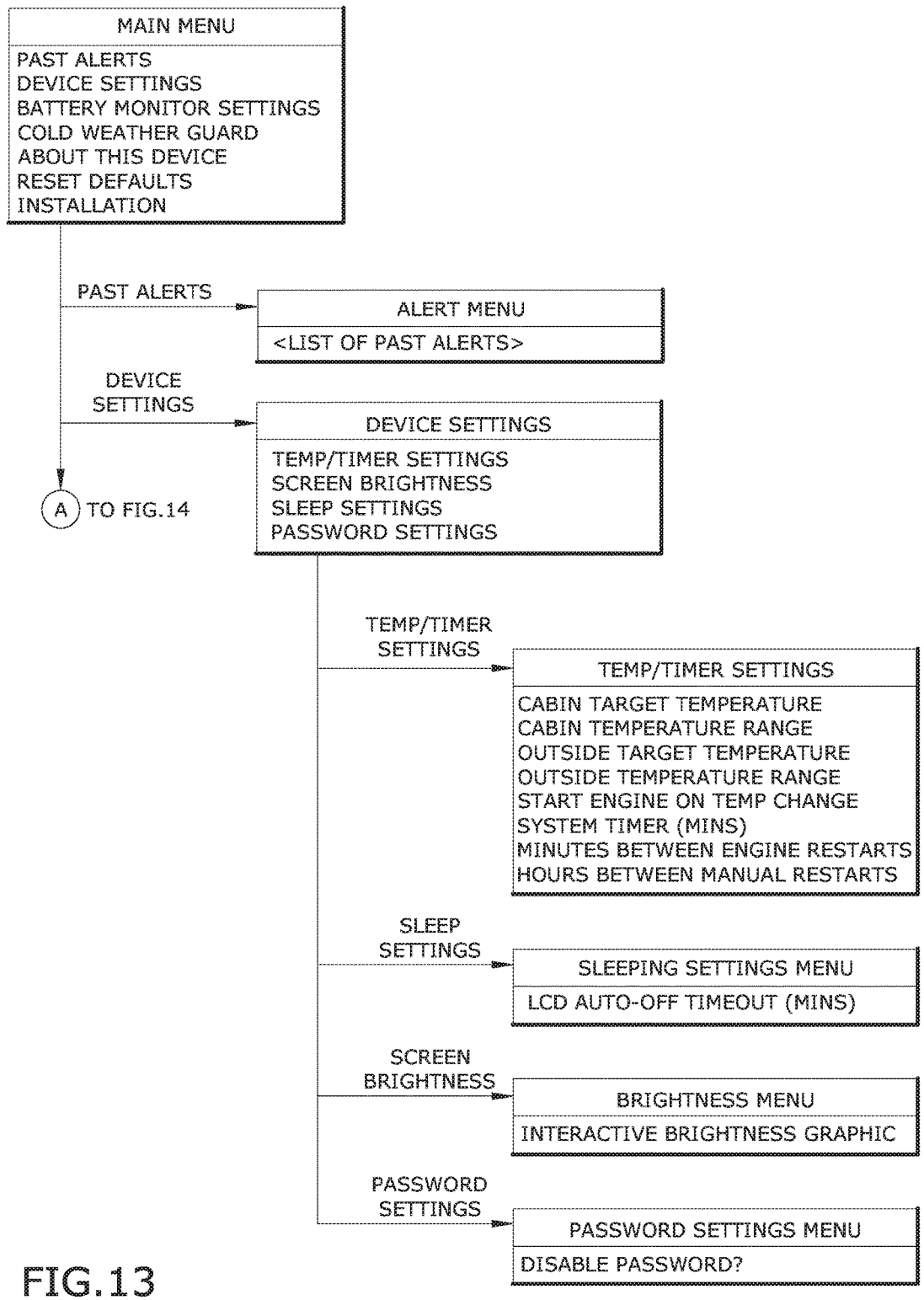
FIG. 13 is a representative menu system for the display and control unit.
Figure 14:
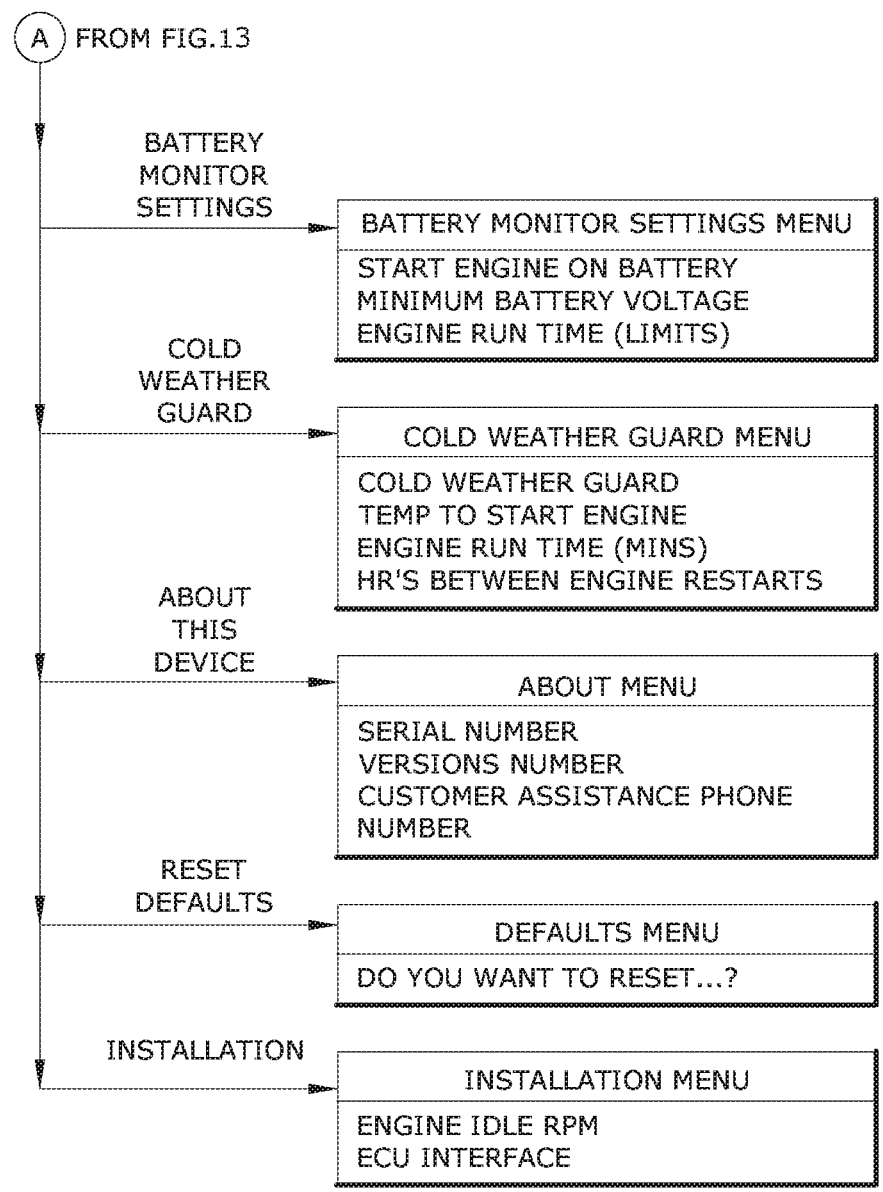
FIG. 14 is a continuation of the menu system for the display and control unit of FIG. 13.
Figure 15:
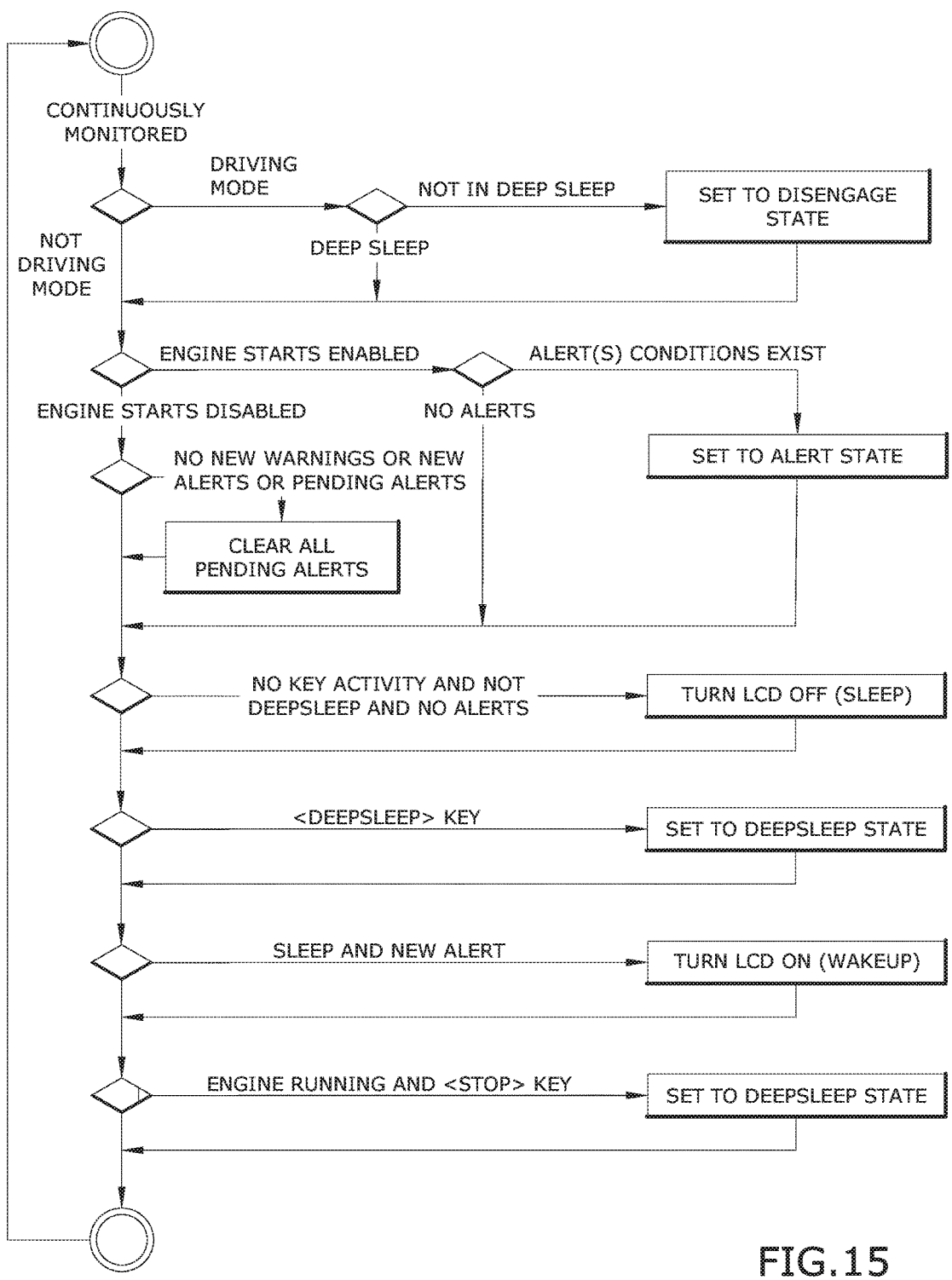
FIG. 15 is a flowchart illustrating enhancements and safety override features of the present invention.

Determining the appropriate battery voltage thresholds are functions of a variety of environmental and operational factors, such as heat, cold, altitude, etc., and so a threshold that is appropriate for one locale is not appropriate for another locale and its associated environmental factors. In addition, since many vehicles have circuit 'disconnects' when voltage dips, predetermined or hard set points are not optimal. The present solution allows the user to individually program the appropriate voltage levels dynamically through a display and control unit 46 shown in reference to FIG. 3, to meet optimal standards based on location, environment, and other vehicle settings.

As seen in reference to FIGS. 3-7, a system for controlling an engine to maintain a battery charge within a vehicle having an engine and a battery, the system comprising: an operator interface for receiving inputs regarding an acceptable range of battery voltages from a vehicle operator and producing signals indicative of said acceptable range. The system also entails an ignition switch 22 which includes on and off positions, the ignition switch 22 producing a signal indicating that the ignition is off. According to other aspects of the invention, a computer module 48 may maintain communication with the engine, the temperature and environmental sensors, the system switch, the operator interface and the ignition switch 22. The computer 48 determines an acceptable range of battery voltage based upon signals received from the operator interface 46. It may also determine whether the engine may be automatically started or stopped and may further control automatic starting and stopping of the engine.

The system may include a user or operator interface 46 for further receiving inputs regarding a maximum continuous run time and produces a signal indicative of said maximum continuous run time.

The system may further comprise an engine compartment switch, for producing a signal indicating that an engine compartment cover is in a closed position; a parking brake switch in communication with the computer and producing a signal that a parking brake is engaged; a transmission neutral switch 51 in communication with the computer 48 and producing a signal indicating that a transmission 50 is in neutral position; a system voltage sensor in communication with the computer 48 and producing a signal indicating that power being supplied to the system is greater than 10.5 V; and an engine speed sensor in communication with the computer 48 and producing signals indicative of engine speed.

As seen in reference to FIGS. 9-12, a system and method for controlling an engine to maintain battery voltage levels within a vehicle having an engine, and a battery, may comprise the steps of: determining an acceptable range of battery voltages based on input from a vehicle operator; determining whether current battery voltage is below the acceptable range; determining whether current operating conditions are acceptable for automatic engine starting; determining whether current operating conditions are acceptable for automatic engine stopping; automatically starting the engine when battery voltage is below said acceptable range and operating conditions acceptable for automatic engine starting are present.

When the battery voltage monitoring feature is enabled, the system should constantly monitor the battery voltage and start the vehicle's engine when the voltage drops below a user-programmed battery voltage threshold. The user-programmed battery voltage threshold is selected from a defined set of values (see Battery Voltage Monitor screen). In certain implementations, when the battery voltage falls below the threshold, the system should initiate the engine startup sequence if all of the safety conditions are met and if a system restart delay time has been met. The temperature and timer settings may be ignored when determining whether to start the engine and during the engine's run time.

The minimum battery voltage level as determined by the vehicle's ECU may still apply to any attempt to start the vehicle's engine. This feature may always be 'On' if it is enabled in the settings menu regardless of whether the system is turned 'Off' (Deep Sleep). This feature may be enabled or disabled (i.e. turned 'on' or 'off') via the Battery Voltage Settings screen on the user interface. When 'on', the battery voltage may be monitored and may initiate a vehicle engine start sequence. In certain embodiments, it may initiate a start sequence, even if the system is in deep sleep mode as the result of being disengaged by the user or as the result of automatically being placed in 'driving mode'. This feature may not be enabled if the system is currently in 'Driving mode'.

According to preferred embodiments of the invention, the system should run for a user-programmed amount of time (see Battery Voltage Monitor Screen). Temperature and timer settings may not be used or capable of shutting down the engine when started for battery charging. After a shut-down, if the system was awakened from deep sleep mode by the battery voltage monitor feature, it may be returned to deep sleep mode. The system may then observe the restart delay time before any type of restart is attempted (time, temperature, battery charging, etc.)

The implementation of the battery voltage monitoring functionality should not adversely affect the temperature or timer functionality of the system. Controls may also be created such that if the cabin temperature sensed by a cabin temperature sensor 32 is changed while the engine is running for battery charging, the controls may prevent the temperature/timer logic from entering a runaway situation. Specifically, these controls may examine the vehicle's cabin temperature and cabin set point prior to the engine start to determine whether the cabin is cool (below set point) or warm (above set point). Upon engine shutdown after a battery charging event, the cabin temperature may again be evaluated to determine if the cabin is 'cool' or 'warm'. If a cool cabin has become warm (or vice versa) as a result of the battery charging cycle, the aforementioned controls may prevent the temperature and timer modes from starting the engine until the cabin has once again been restored to its prior cool or warm environment (as a result of the ambient outside temperature, monitored by an outside temperature sensor 30).

The system and method of the present invention may also include a cold weather guard. When this feature is enabled, the Idle Smart system may start the vehicle if the system is in Deep Sleep mode and the outside temperature falls below a certain temperature threshold.

The system should initiate the engine startup sequence only if all of the safety conditions are met and if the system Restart Delay time has been met and if the Cold Weather Restart delay time has also been met. The temperature and timer settings may be ignored when determining whether to start the engine and during the engine's run time.

The Idle Smart system should run for a user-programmed amount of time (see Cold Weather Guard Screen). Temperature and timer settings may not be used or capable of shutting down the engine when started due to cold weather. After shut-down, the system may return to Deep Sleep mode and observe the Restart Delay time before any type of restart is attempted (time, temperature, battery charging, etc.) Additionally, the system may also observe the Cold Weather Restart Delay time before another Cold Weather restart is attempted. This feature is always 'On' if it is enabled in the settings menu and the system is turned 'Off' (Deep Sleep). This feature is 'Off' if the system is 'On'.

The implementation of the Cold Weather Guard functionality should not adversely affect the legacy temperature or timer functionality of the system. Controls are to be created such that if the cabin temperature is changed while the engine is running due to the cold weather guard, the controls may prevent the legacy temperature/timer logic from entering a runaway situation. Specifically, these controls may examine the vehicle's cabin temperature and cabin set point prior to the engine start to determine whether the cabin is cool (below set point) or warm (above set point). Upon engine shutdown after a cold weather guard event, the cabin temperature may again be evaluated to determine if the cabin is 'cool' or 'warm'. If a cool cabin has become warm (or vice versa) as a result of the cold weather guard cycle, the aforementioned controls may prevent the temperature and timer modes from starting the engine until the cabin has once again been restored to its prior cool or warm environment (as a result of the ambient outside temperature).

A method according the present invention may further comprise automatically stopping the engine when the programmed run time has expired and operating conditions acceptable for automatic engine stopping are present. In other aspects of the invention, the method may automatically stop the engine when programmed run time has been satisfied.

In some embodiments, the step of determining the acceptable range of battery voltage and run times may comprises recognizing the programmed battery voltage. In other embodiments, it may include recognizing run times and both limits inputted into an operator interface by the vehicle operator. The method may also involve the operating conditions acceptable for automatic engine starting which comprise detecting an ignition switch 22 in an off position.

The method may also specify the operating conditions acceptable for automatic engine starting further as comprising at least one of the following conditions: a parking brake that is engaged, a transmission in neutral position, a hood that is closed, the engine having a speed of substantially 5 rpm or less, and the battery having a voltage of greater than 10.5 V.

The system is comprised of a computer unit 48, which may be mounted on the motor vehicle 52, preferably under the dashboard of the vehicle 52. The system further comprises a display unit 46, mounted within the cabin of the vehicle 52, such as on the dashboard of the vehicle. In a wired configuration, the system includes one or more wiring harnesses to interconnect the computer unit 48, the display unit 46, a hood switch 34 34, and a neutral safety switch 51. The components of the system may also be implemented with wireless communications.

As seen in reference to FIGS. 11A-11B, the display unit 46 may also provide a programmable user interface that is in communication with the underdash computer module 48. The user interface may receive user inputs to specify battery voltage thresholds for the system to monitor. It may also receive user inputs to specify an engine run time to recharge the battery.

In certain embodiments, the computer module 48 may be operatively connected to the harness, which connects the system with the vehicle 52 and a vehicle computer. The system may also include a hood switch 34 and neutral safety switch that provide inputs as to whether to engine compartment is closed and the whether the vehicle is in neutral, respectively. These may also be interconnected with the system via the harness. The harness may also connect to the ignition of the vehicle 52 as well as the battery so as to gain a voltage reading. Each of these components are relayed to the underdash unit 48.

According to implementations of the system and method, if the underdash computer unit 48 detects that the battery voltage has fallen below a programmed level (e.g., 11.2 V), the system initiates a system safety and operating check. If system safety and operating checks are positive, the system may initiate an automatic start of the truck 52. If system safeties and/or operating conditions are violated during run, the system may cease operation of vehicle 52. If system safeties and operating conditions remain appropriate, the engine may run for programmed amount of time and then shut down vehicle 52.

The system of the present invention is a mix between physical hardware—the harness, underdash computing unit 48, the display unit 46 and safety switches (Hood, Neutral)—and software. The software is comprised of software that can adequately interface with the vehicle's software system and marry that with software logic that can adequately and safely start, run, and shut down the vehicle 52 as needed.

To be effective, the system needs to be installed on a motor vehicle 52 in order to receive the benefits it provides. The installation of the product can be done at any point during the lifecycle of the vehicle 52. To install and use the invention, the first step may be to install and connect the hood switch 34. A second step is to connect the system to the vehicle's power. A third step would be to connect to the vehicle's ignition system. A fourth step may include installing and connecting the neutral safety switch 51. A fifth step may be to connect to the vehicle's computer. A sixth step could be to connect the harness to the underdash unit 48; the seventh step would be to connect the underdash unit 48 to the display unit 46. An eighth step could be to program the display unit 46.

It should be understood, of course, that the foregoing relates to exemplary embodiments of the invention and that modifications may be made without departing from the spirit and scope of the invention as set forth in the following claims.

What is claimed is:

1. A system for monitoring and recharging a motor vehicle battery, comprising:
a computing module, operatively connected to a computing system, an ignition system, and a battery voltage source of a motor vehicle;
a display unit operatively connected to the computing module, the display unit presenting a user interface for providing a user input of a minimum battery voltage threshold for the computing module to monitor;
wherein the computing module initiates an engine start sequence to start an engine of the motor vehicle when the minimum battery voltage threshold has been reached.

2. The system of claim 1, further comprising:
wherein the computing module initiates a battery charging event responsive to the engine start sequence.

3. The system of claim 1, further comprising:
a hood safety switch in communication with the computing module, wherein the hood safety switch is configured to determine a closed and an open condition of a hood of the motor vehicle.

4. The system of claim 3, wherein:
if the hood safety switch indicates the closed condition of the hood, the engine start sequence is enabled.

5. The system of claim 3, wherein:
if the hood safety switch indicates the open condition of the hood, the engine start sequence is disabled.

6. The system of claim 1, further comprising:
a duration control settable via the user interface to specify a running duration of the motor vehicle engine after the engine start sequence.

7. The system of claim 6, further comprising:
operating the motor vehicle engine for the specified running duration.

8. The system of claim 7, further comprising:
a cabin temperature sensor in communication with the computing module, the cabin temperature sensor configured to detect a cabin temperature of the motor vehicle.

9. The system of claim 8, further comprising:
a cabin temperature setting control settable vie the user interface to specify a cabin temperature set point.

10. The system of claim 9, further comprising:
operating the motor vehicle engine beyond the specified running duration until the cabin temperature set point is attained.

11. The system of claim 9, further comprising:
disabling the start sequence until the cabin set point is attained.

12. The system of claim 6, further comprising:
initiating an engine shut down sequence after expiration of the running duration.

* * * * *